United States Patent
Beckmann (10) Patent No.: US 7,948,227 B2
(45) Date of Patent: May 24, 2011

(54) ELECTRICAL CIRCUIT DIAGNOSTIC TOOL

(76) Inventor: Robert U. Beckmann, Durham, NC (US)

( * ) Notice: Subject to any disclaimer, the term of this patent is extended or adjusted under 35 U.S.C. 154(b) by 124 days.

(21) Appl. No.: 12/206,014

(22) Filed: Sep. 8, 2008

(65) Prior Publication Data

US 2010/0060303 A1    Mar. 11, 2010

(51) Int. Cl.
*G01R 15/10* (2006.01)
(52) U.S. Cl. .................. 324/72.5; 324/99 D; 324/115
(58) Field of Classification Search .................. None
See application file for complete search history.

(56) References Cited

U.S. PATENT DOCUMENTS

| | | | | |
|---|---|---|---|---|
| 3,689,835 A | * | 9/1972 | Bickfrod | 324/115 |
| 4,228,394 A | * | 10/1980 | Crosby | 324/712 |
| 4,254,375 A | * | 3/1981 | Matsuoka | 324/115 |
| 4,298,837 A | * | 11/1981 | Koslar | 324/72.5 |
| 4,532,470 A | * | 7/1985 | Wiesmann | 324/76.11 |
| 4,803,459 A | * | 2/1989 | Ta | 340/459 |
| 5,365,164 A | * | 11/1994 | Lowenstein et al. | 324/76.21 |
| 5,612,616 A | * | 3/1997 | Earle | 324/72.5 |
| 5,923,161 A | * | 7/1999 | Frankovitch et al. | 324/115 |
| 6,356,853 B1 | | 3/2002 | Sullivan | |

* cited by examiner

*Primary Examiner* — Vinh P Nguyen (57) ABSTRACT

Diagnosing electrical circuit faults can be accomplished with a variety of tools. Voltmeters are frequently used to measure voltage to determine whether a short is present, but are not well-suited for finding intermittent faults caused by corroded connectors or excessive voltage drop under operating loads. Measuring a static voltage without load using a voltmeter can yield misleading results. A diagnostic tool that is simple to use and that yields a definitive result is preferred in certain applications such as automotive electrical system diagnosis due to the varying skill level of technicians and the variation in field conditions in automotive shops. A simple, inexpensive diagnostic tool that can be used with minimal or no training allows rapid diagnosis of circuit faults that result from a the inability of a measured circuit to supply a minimum current at a minimum voltage.

18 Claims, 5 Drawing Sheets

ELECTRICAL CIRCUIT DIAGNOSTIC TOOL

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention generally relates to a diagnostic tool that can measure voltage under controlled conditions and vary a point load in order to determine the capacity of a given circuit to operate under typical or extreme conditions rather than ideal conditions.

2. Background

A conventional voltmeter measures voltage at a given point in a circuit using a high-impedance input. The goal with such a voltmeter is to determine the voltage present at the measured contact point without imposing any significant load on the point. A high-impedance input (relative to the impedance of the point contact) ensures that the voltmeter measures the point contact without changing the current flow within the measured circuit.

In certain applications however it is important to be able to measure a circuit's ability to deliver a minimum or threshold voltage under a specified constant or variable load that provides an indication of the health of the circuit. While such diagnostic tools may exist in certain fields, such tools are often expensive or difficult to use. One example of such a diagnostic tool is a curve tracer for semiconductor (active) and passive devices. A curve tracer can load an active or passive device with a varying voltage to induce a range of currents in such devices and display a graph of voltage versus current that provides the characteristics of the measured device. The use of a curve tracer requires some training and user expertise in the types of devices being measured. Curve tracers are relatively expensive diagnostic tools, and are generally designed for laboratory use only. Therefore, a need exists for improvement in the field of diagnostic tools that are inexpensive and require no user training, expertise or special training.

In the case of automobile electrical systems, it is increasingly common to find control units and actuators that are switched on and off with pulse-type signals rather than direct connections to a switch that provides a driving current. It is difficult to diagnose a fault in such a system because although a suitable voltage is typically present when the system is energized, it is not possible to determine whether a suitable current can be delivered to the control unit or actuator under an actual load, or whether a required minimum operating voltage will be present under a worst case current load condition. A digital voltmeter cannot be used in such an instance because such a device cannot respond as quickly as the circuit is switched, and may therefore indicate suitable average voltage while the necessary minimum voltage is not present under a momentary pulse-type switching condition. The diagnostic tool of the present invention can initiate a pulse-type load and measure the voltage level during the pulse-type load, as well as the available current capability of the measured circuit when the measured voltage drops to a pre-determined threshold voltage.

3. Description of Related Art

There are numerous types of diagnostic tools used to measure voltages in circuits including voltmeters, oscilloscopes, curve tracers, logic analyzers, and the like. A simple voltmeter allows a user to select a voltage range and apply test leads to the circuit to be measured. Voltmeters are high-impedance devices intended to measure a point contact without loading the measured circuit, since circuit loading can cause the circuit characteristics to change and thereby yield an incorrect voltage reading. A voltmeter is relatively simple to use, but does require the user to apply the test leads to the point contact as well as a reference point (often a ground or zero voltage reference, but also a secondary point contact). All voltmeters can measure a constant voltage, and some can measure a time varying voltage such as 50/60 cycle alternating current. However, the measurement of a time varying voltage requires that the voltmeter be optimized for a known time varying voltage such as those present in ordinary household sinusoidal alternating current circuits. An oscilloscope allows a user to measure a constant or time varying voltage and display the result in a graphic format. Oscilloscopes also use high impedance inputs in order to measure circuit voltages without loading the measured circuit. A curve tracer can be used to measure the electrical characteristics of a device by varying an input voltage and then displaying the result graphically.

While each of the above diagnostic tools are useful in varying instances, the cost of the device, limited diagnostic ability, and need for varying degrees of user skill limits the usefulness of such tools in certain applications.

The most cost-effective diagnostic tool for measuring a voltage at a point contact is generally a voltmeter. Prior art voltmeters are effective in the instance where a voltage measurement without load is desired. However, if a user desires to measure a point contact under a varying load, or needs to determine the load under which the measured voltage drops below a predetermined minimum value, a more sophisticated diagnostic tool is required. However, there currently exists no diagnostic tool that combines the ease of use of a conventional voltmeter with the ability to automatically measure a voltage under a varying load and determine the load at which the point contact measurement crosses a minimum value.

In one application of a diagnostic tool of the present invention, an automotive mechanic can use the diagnostic tool to measure a point contact voltage and receive an audible or visual indication from the diagnostic tool that the desired minimum voltage is present upon the automatic application of a predetermined minimum circuit load.

The diagnostic tool of the present invention provides for a small, relatively inexpensive device that can be used by an unskilled user to determine whether a point contact voltage can be delivered through the measured circuit under a given load. An objective of the present invention therefore is to be able to automatically measure such a point contact voltage and determine the load at which the voltage drops below a specific or predetermined value.

SUMMARY OF THE INVENTION

The diagnostic tool of the present invention accomplishes the above objectives in the manner described below.

In one embodiment of the present invention, the diagnostic tool comprises a handheld device with a pigtail lead that can be attached to a ground or other voltage reference point contact, a probe for contacting the desired point contact to be measured, a button for initiating a test measurement, a microprocessor or microcontroller for running a test measurement sequence, voltage and current measuring elements, an element that can apply a time-varying load to the circuit under test, and a display that yields a diagnostic result. The display can show an indication that the diagnostic device is properly calibrated and ready for use, the measured voltage difference between the probe and the pigtail lead, an indication that the diagnostic test is being run, and an indication that the measured circuit passed a load test. Such a diagnostic tool can be powered from the circuit being measured, or by an internal battery.

In another embodiment of the present invention, the diagnostic tool described above may also comprise a non-volatile memory for storing test results and an output port for exporting test results stored in such non-volatile memory.

In another embodiment of the present invention, the diagnostic tool may be embedded in a comprehensive vehicle diagnostic system that simultaneously probes a plurality of point contacts in an electrical system, and that automatically measures a plurality of circuits simultaneously when such a comprehensive vehicle diagnostic system is connected to a vehicle test/diagnostic connector.

It is an objective of the diagnostic tool of the present invention to be able to automatically determine voltage drop across measured elements of an electrical circuit. It is a further objective of the present invention to be able to automatically determine voltage drop across measured elements of a motor vehicle electrical system thereby determining whether a given circuit element or device is defective or whether such circuit element or device "tests bad" because the electrical system is incapable of delivering adequate current and/or a minimum required voltage.

It is recognized that a variety of form factors may be employed for the diagnostic tool disclosed herein.

BRIEF DESCRIPTION OF THE DRAWINGS

One or more preferred embodiments of the present invention now will be described in detail with reference to the accompanying drawings, wherein the same elements are referred to with the same reference numerals.

DETAILED DESCRIPTION

As a preliminary matter, it will readily be understood by one having ordinary skill in the relevant art (an "Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended to, nor is to be construed to, limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, one or more preferred embodiments of the present invention are next described. The following description of one or more preferred embodiments is merely exemplary in nature and is in no way intended to limit the invention, its implementations, or uses.

Figure 1:
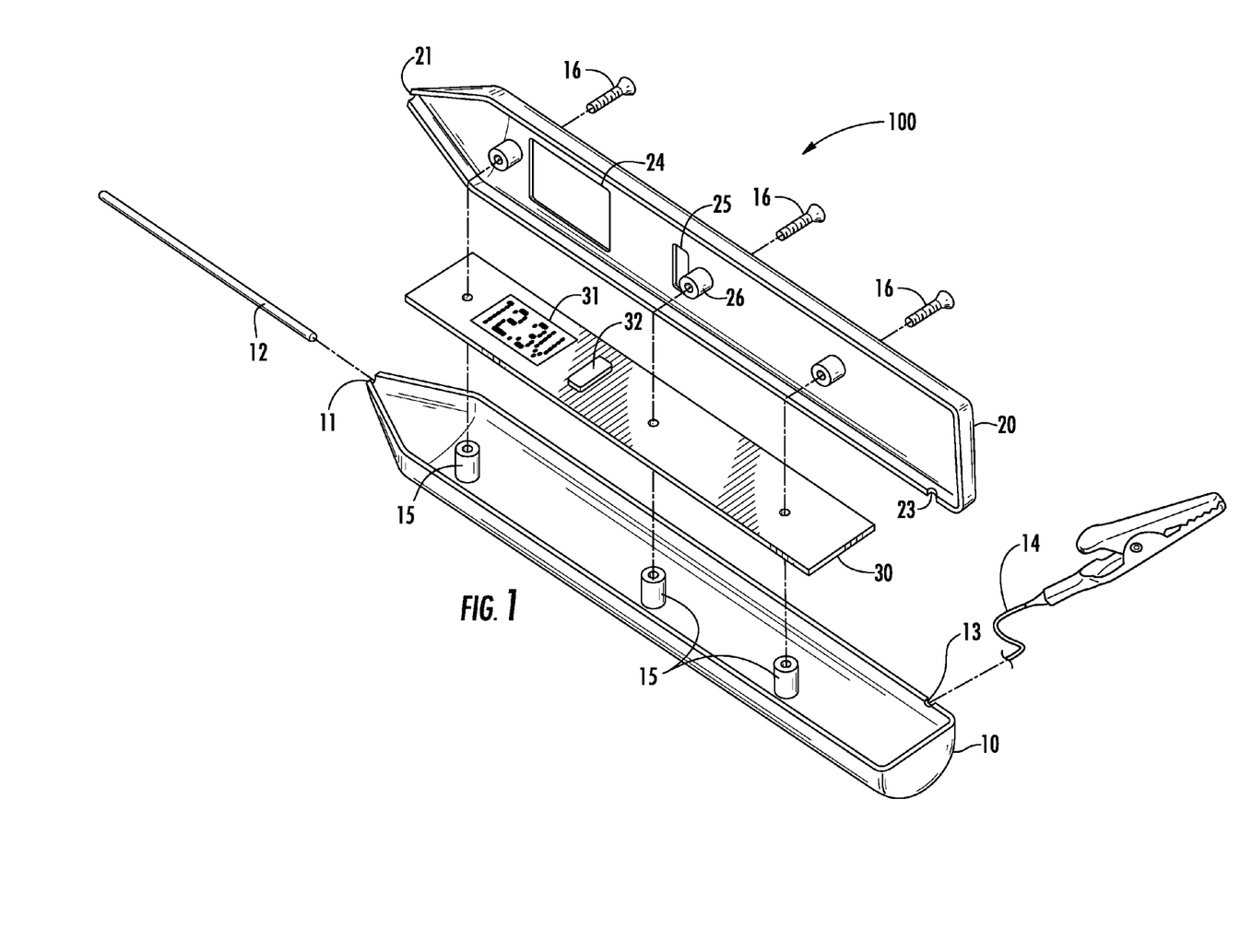
FIG. 1 illustrates an exploded view of the diagnostic tool in accordance with one or more preferred embodiments of the present invention.

FIG. 1 illustrates an exploded view of the diagnostic tool in accordance with one or more preferred embodiments of the present invention. As shown therein, the electrical circuit diagnostic tool 100 of the present invention includes two case halves 10 and 20, and a circuit board 30. The bottom case half 10 shows a first opening 11 for a measurement probe 12 and a second opening 13 for a pigtail-type lead wire 14, as well as bosses 15 for accepting screws 16 when assembled to the top case half 20. The top case half 20 also shows a first opening 21 for a probe 14, a second opening 23 for a pigtail-type lead wire 14, a third opening 24 for the bezel of a display element 31, a fourth opening 25 for a push button 32, as well as holes 26 (with bosses) for passing screws 16 through the top case half 20 for use in engaging bosses 15 to secure the top case half 20 to the bottom case half 10. The circuit board 30 shows a display element 31 and a button 32. The probe 12 and the pigtail-type lead 14 are mechanically and electrically affixed to the circuit board 30. The circuit board 30 is assembled with the bottom case half 10 by being positioned over bosses 15 and fastened securely between the bosses 15 of the bottom case half 10 and the bosses 26 of the top case half 20 with screws 16.

Figure 2A:
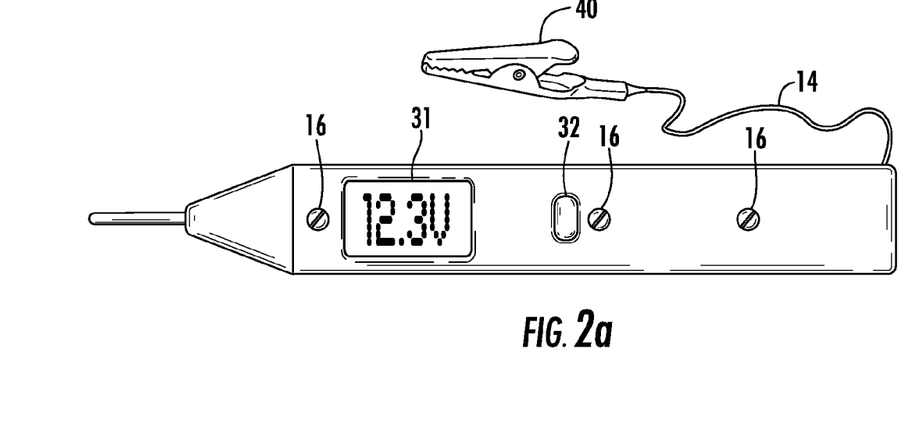
FIG. 2a illustrates a top view of the diagnostic tool in accordance with one or more preferred embodiments of the present invention.
Figure 2B:
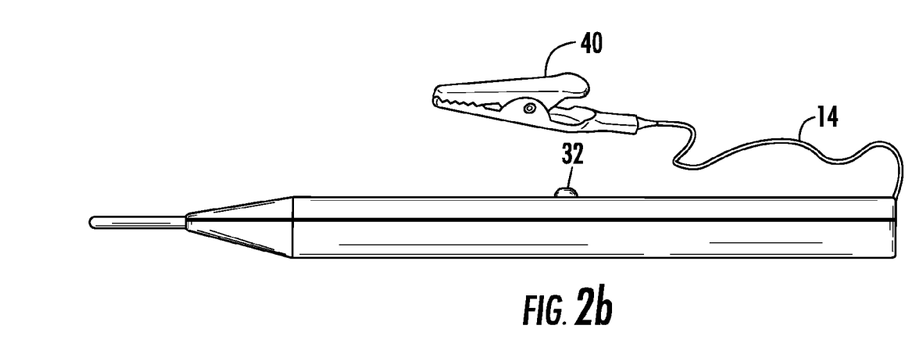
FIG. 2b illustrates a side view of the diagnostic tool in accordance with one or more preferred embodiments of the present invention.

FIGS. 2a and 2b illustrate a top and side view, respectively, of the electrical circuit diagnostic tool 100 in accordance with one or more preferred embodiments of the present invention. FIG. 2a shows a pigtail-type lead wire 14 with an attached alligator-type clip 40 passing through one side of the assembled bottom and top case halves of the diagnostic tool, and a measurement probe 14 passing through one end of the diagnostic tool. A display element 31 is visible from the top elevation and displays the operational status and measurements of the diagnostic tool of the present invention. A button 32 is accessible from the top elevation of the diagnostic tool. FIG. 2b illustrates a side view of the diagnostic tool in accordance with one or more preferred embodiments of the present invention.

Figure 3:
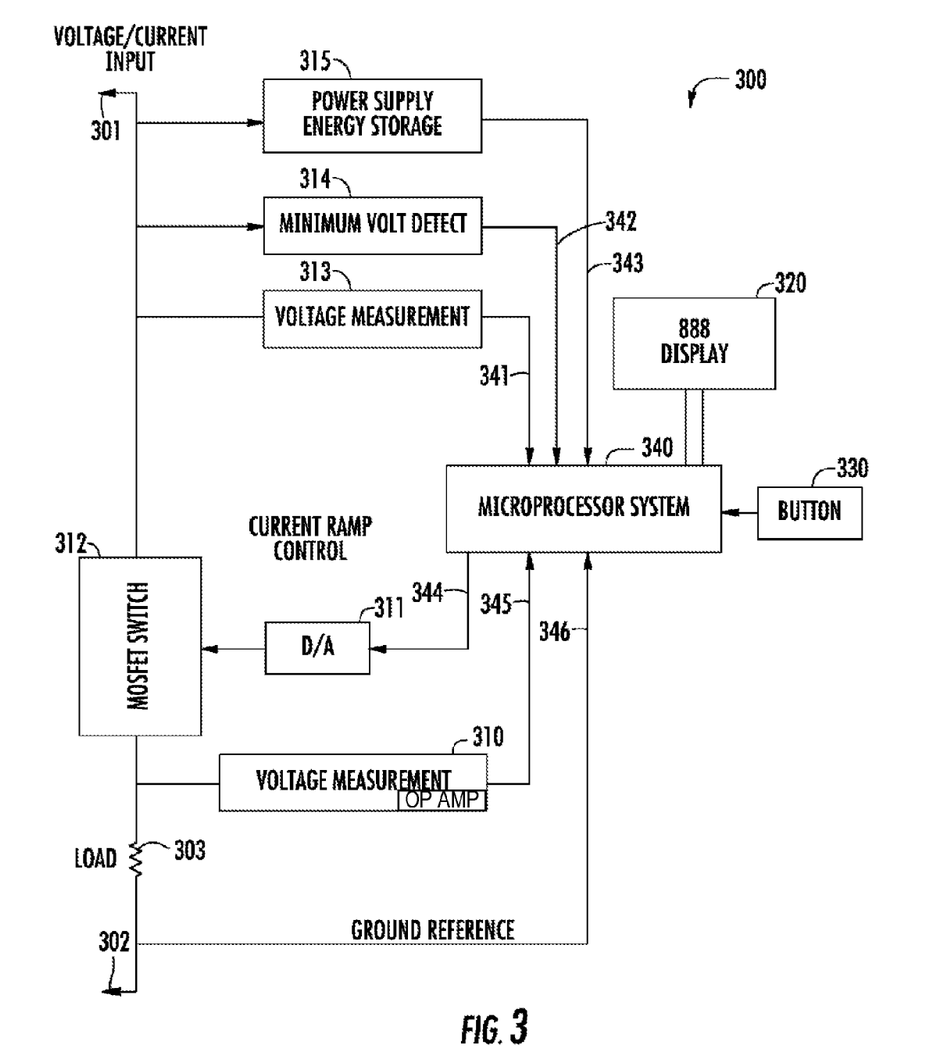
FIG. 3 illustrates a schematic diagram of the diagnostic tool of FIG. 1.

FIG. 3 illustrates a schematic diagram 300 of the diagnostic tool in accordance with one or more preferred embodiments of the present invention. As shown therein, the apparatus illustrated in schematic diagram 300 comprises an active circuit element 312, a passive load element 303, a microcontroller or microprocessor 340, a display 320, a button 330, a power storage element 315, a minimum voltage detector 314, a voltage measurement element 313, a digital-to-analog converter 311, and a voltage measurement element 310.

In order to measure a voltage and the capability of a circuit to deliver a given current at a given voltage using an apparatus embodied in the present invention, a contact 302 is connected to a reference point or to a ground, and a circuit probe 301 is connected to the circuit at the point to be measured. A fixed load element 303 such as a resister of known value and an active device element 312, is suitably enabled to apply a varying load to the circuit being measure through circuit probe 301. In one embodiment of the present invention, active device element 312 is a MOSFET transistor. A microprocessor 340 is suitably enabled to accept several inputs as described below, as well as to send a digital signal to a digital-to-analog converter 311, and a message to a display device 320. In a further embodiment of the present invention, a microprocessor 340 is suitably enabled to store the voltage values at inputs 341 and 345 for later retrieval and analysis. A digital-to-analog converter 311 sends an analog output voltage that is applied to an active circuit element 312, thereby controlling the current that is allowed to flow through passive load element 303 and the current that is thereby drawn from the circuit being measured. A button 330 is used to initiate a measurement sequence pre-programmed and stored in the non-volatile memory of microprocessor 340. A circuit element 315 is an energy storage element such as a capacitor capable of storing sufficient power derived from point contact 301 to power microprocessor 340 through an input 343 while a test measurement is being made. A circuit element 314 is a minimum voltage detector that provides a signal to input 342 of microprocessor 340 when a minimum threshold voltage is detected. A circuit element 313 is a voltage measurement device that provides a real-time voltage measurement to microprocessor input 341. A voltage measurement element 310 determines the voltage present across a known load element 303, and thereby can determine the instantaneous current flowing out of a point contact 301. The voltage present across a known load element 303 is sent to input 345 of microprocessor 340, which in turn can be used to determine the current load supplied by the measured circuit.

Pressing a button 330 initiates a pre-programmed test sequence stored in microprocessor 340 that generates a digital signal on output pin 344 of microprocessor 340. This digital output signal is presented to the input of a digital-to-analog converter 311, which in turn presents an analog output voltage to a circuit element 312. In one embodiment of the present invention, circuit element 312 is a MOSFET and the analog output voltage of digital-to-analog converter 311 is connected to the gate of the MOSFET, thereby controlling the current that is drawn from the point contact 301. As the pre-programmed test sequence progresses, the microprocessor 340 provides a digital output signal on output 344 that ramps up over time, thereby causing the digital-to-analog converter 311 to apply a continuously ramping analog voltage to the gate of MOSFET 312, which in turn results in a continuously ramping current draw on the point contact 301.

A voltage measurement circuit element 310 measures a voltage on the load side of circuit element 303, and presents this voltage value to microprocessor input 345. The microprocessor 340 is suitably enabled to determine the current drawn from a point contact 301 by comparing the voltage differential between the microprocessor inputs 345 and 346 and determining the current drawn through known circuit load element 303. The current is measured at the moment that the microprocessor 340 senses that the pre-determined minimum voltage is present at the point contact 301 as determined by the voltage measurement element 313. If the minimum required current is sensed before the voltage sensed at point contact 301 drops below the pre-determined reference voltage, the measured circuit is deemed to have passed the test and the microprocessor 340 sends an appropriate signal to a display element 320. The microprocessor 340 is suitably enabled to stop the test once it is determined that the circuit passes the test, or it can continue to ramp the current draw until such time as the pre-determined minimum voltage measured at the contact point 301 is determined by the minimum voltage detector element 314. An appropriate signal to be displayed on a display element 320 can be the word "pass" or the like, or it can merely display the measured current at the time the pre-determined minimum voltage is sensed at point contact 301.

Figure 4:
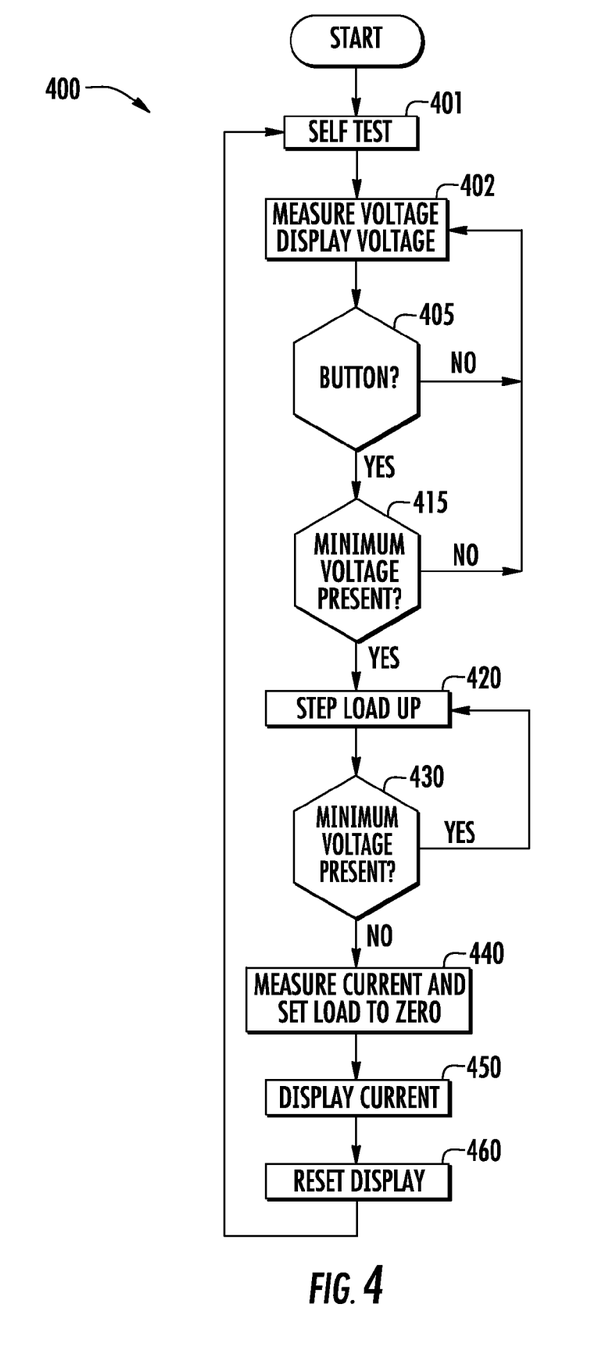
FIG. 4 is a flowchart illustrating a process for measuring a point voltage and determining whether a circuit can supply a given current, all in accordance with one or more preferred embodiments of the present invention.

FIG. 4 is a flowchart illustrating a process 400 for measuring a point voltage and determining whether a circuit can supply a given current, all in accordance with one or more preferred embodiments of the present invention. The process 400 can be used to test the condition of a circuit by determining the capability of a measured point contact to supply a given current under load while maintaining a pre-determined minimum voltage. The process 400 begins at process step 401 where a self-test routine is automatically run in the presence of adequate voltage at the measured point contact. The process then proceeds to step 402 where the process measures the voltage present at a point contact under no load and displays the measured voltage on a display device or other display indicator. At step 405, the process determines whether a button is pushed to initiate a test sequence. If not, the process loops back to step 402 and the measured voltage continues to be displayed. If the button is pushed, the process proceeds to step 415 where the process determines whether a pre-determined minimum voltage is present at the point contact being measured. If such minimum voltage is not present at the point contact, the process loops back to step 402 where the measured voltage continues to be displayed and the process again proceeds to step 405 as above.

If the process determines at step 415 that a pre-determined minimum voltage is present at the point contact, the process proceeds to step 420 where the process applies an incremental increase to the current load on the point contact. The process then proceeds to step 430 where the process measures the voltage at the point contact and determines if the voltage continues to exceed the pre-determined minimum voltage. If so, the process loops back to step 420 where the current load is increased incrementally. The loop of process steps 420 and 430 continue until such time as step 430 determines that the voltage at the point contact no longer exceeds the pre-determined minimum voltage, at which time the process proceeds to step 440.

At step 440, the process measures the current being drawn from the measured circuit, and stores the value of the measured current load in a memory, and the process drops the current load on the point contact to zero. The process then proceeds to step 450 where the stored value of the measured current load is displayed. At step 460, the process clears the stored value of the measured current load, and the process loops back to step 401 and the process 400 repeats until an adequate voltage is no longer present at the measured point contact.

In another embodiment of the present invention, the process 400 may modified to store each voltage measured at step 402 and the corresponding load at step 420 for later retrieval and analysis.

Figure 5:
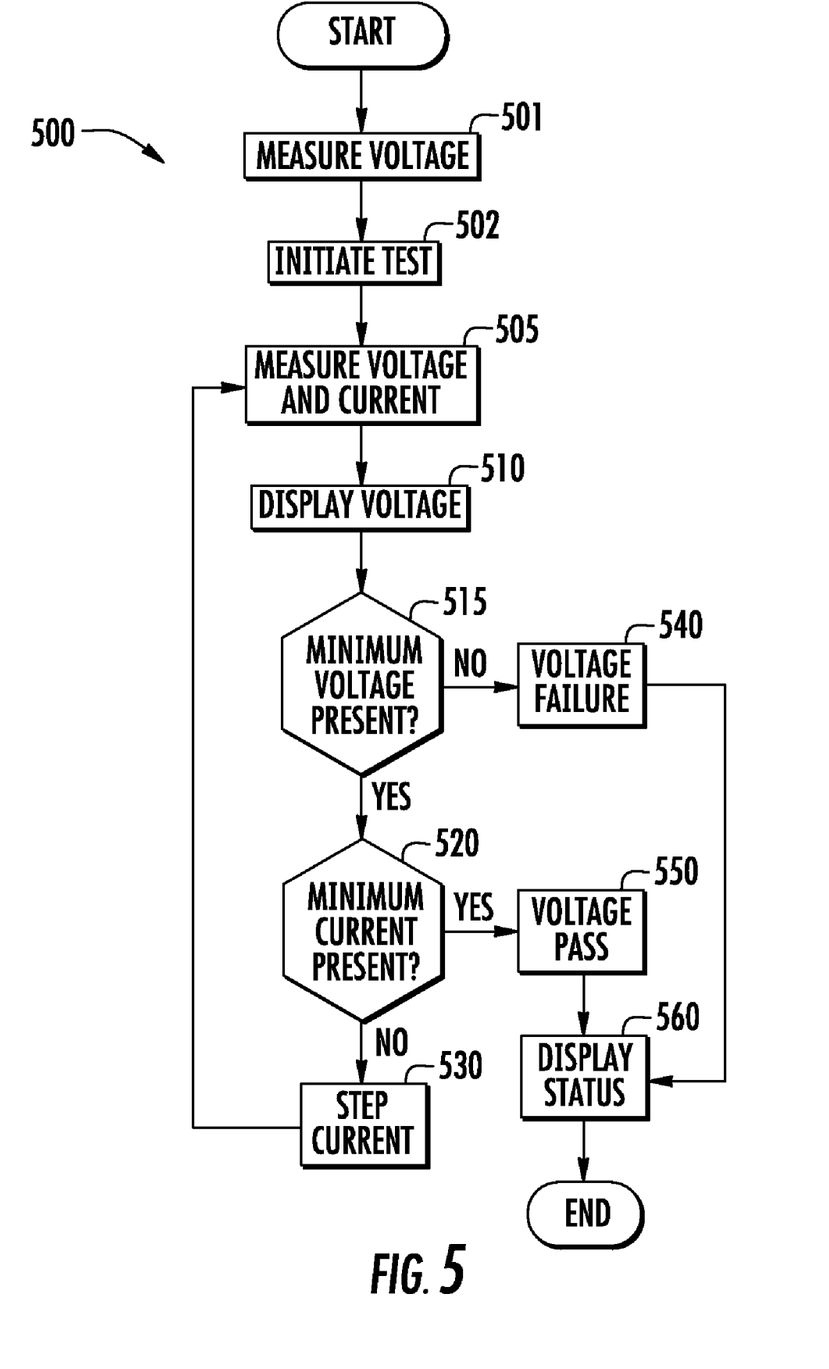
FIG. 5 is a flowchart illustrating a process for determining whether a circuit is capable of supplying a given current while maintaining a given minimum voltage, all in accordance with one or more preferred embodiments of the present invention.

FIG. 5 is a flowchart illustrating a process 500 for a process for determining whether a circuit is capable of supplying a given current while maintaining a given minimum voltage, all in accordance with one or more preferred embodiments of the present invention. The process 500 can be used to test the condition of a circuit by determining the capability of a measured point contact to supply a given current under load while maintaining a pre-determined minimum voltage. The process 500 begins at process step 501 where an initial voltage measurement is made. The process then proceeds to step 502 when a button is pushed to initiate a test sequence. At step 505, the process measures the voltage present at a point contact and measures a load current being drawn from such point contact. The process proceeds to step 510 where the measured voltage is displayed on a display device. The process then proceeds to step 515 where the process determines whether a pre-determined minimum voltage is present at the point contact. If such minimum voltage is not present, the process proceeds to step 540 where a message is generated to indicate that the minimum voltage is not present and the test has failed. The process then proceeds to step 560 where the status of the test is displayed on a display device, and then the process 500 ends.

If the process 500 determines at step 515 that a pre-determined minimum voltage is present at the point contact, the process then proceeds to step 520 where the process determines if a pre-determined minimum current can be drawn from the point contact. If the pre-determined minimum current is not being drawn from the point contact, the process proceeds to step 530 where the process increases the current load drawn from the point contact. The process then returns to step 505 and continues. If the process determines at step 520 that a pre-determined minimum current is being drawn from the point contact, the process proceeds to step 550 where a message is generated to indicate that the minimum voltage is present at the time the pre-determined minimum current is being drawn from the point contact and the circuit has passed the test. The process then proceeds to step 560 where the status of the test is displayed on a display device, and then the process ends.

In another embodiment of the present invention, the process 500 may modified to store each voltage and current measured at step 505 for later retrieval and analysis.

Based on the foregoing description, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements, the present invention being limited only by the claims appended hereto and the equivalents thereof.

What is claimed is:

1. An electrical circuit diagnostic tool that is adapted to measure current in a circuit, comprising:
    first and second circuit measurement inputs;
    a manual switch for initiating a circuit testing routine;
    a microcontroller for running a circuit testing routine in response to activation of the manual switch by a user;
    an active circuit loading element operated under the control of the microcontroller during the circuit testing routine;
    a voltage measuring element;
    a current measuring element; and
    a display element;
    wherein the microcontroller adjusts the active circuit loading element during the circuit testing routine such that at least one of the voltage measuring element and the current measuring element iteratively measures a varying voltage or current, respectively; and
    wherein said first circuit measurement input is a pigtail-type lead, said second circuit measurement input is a metal probe, said switch is a momentary contact pushbutton, said display element is a multi-segment LED display or a multi-segment LCD display or other display device type, and said microcontroller determines, via the circuit testing routine, whether the measured circuit is capable of supplying a given minimum current at a given minimum voltage.

2. The diagnostic tool of claim 1 wherein said circuit loading elements are a transistor and a resistor.

3. The diagnostic tool of claim 2 wherein said transistor is a MOSFET.

4. The diagnostic tool of claim 3 wherein a time-varying load is applied to a circuit under measurement by applying a time-varying voltage to the gate of said MOSFET.

5. The diagnostic tool of claim 4 wherein said microcontroller is suitably enabled to:
measure the voltage and current being supplied by the measured circuit at the instant that the voltage drops below said given minimum voltage; and
display the measured current on a display element.

6. The diagnostic tool of claim 5 wherein said microcontroller is suitably enabled to automatically run a self-test diagnostic routine upon the initial presence of adequate voltage differential between said first and second circuit measurement inputs.

7. The diagnostic tool of claim 4 wherein said microcontroller is suitably enabled to:
measure the voltage and current being supplied by the measured circuit;
determine if the measured voltage drops below said given minimum voltage before said given minimum current is detected; and
display a message on a display element indicating a low-voltage failure condition.

8. The diagnostic tool of claim 4 wherein said microcontroller is suitably enabled to:
measure the voltage and current being supplied by the measured circuit;
determine if the measured voltage remains at or above said given minimum voltage at the instant said given minimum current is detected; and
display a message on a display element indicating an adequate voltage and current condition.

9. An electrical circuit diagnostic tool that is adapted to measure current in a circuit, comprising:
first and second circuit measurement inputs;
a switch for initiating a circuit testing routine;
a voltage measuring element;
circuit loading elements;
a display element; and
a microcontroller for running the circuit testing routine, in response to initiation by the switch, to determine whether the measured circuit is capable of supplying a given minimum current at a given minimum voltage.

10. The diagnostic tool of claim 9 wherein said first circuit measurement input is a pigtail-type lead, said second circuit measurement input is a metal probe, and switch is a momentary contact push-button.

11. The diagnostic tool of claim 10 wherein said circuit loading elements include a transistor and a resistor.

12. The diagnostic tool of claim 11 wherein said transistor is a MOSFET.

13. The diagnostic tool of claim 12 wherein a time-varying load is applied to the measured circuit by applying a time-varying voltage to the gate of said MOSFET.

14. The diagnostic tool of claim 13 wherein said microcontroller is suitably enabled to:
measure the voltage and current being supplied by the measured circuit at the instant that the voltage drops below said given minimum voltage; and
display the measured current on a display element.

15. The diagnostic tool of claim 14 wherein said microcontroller is suitably enabled to automatically run a self-test diagnostic routine upon the initial presence of adequate voltage differential between said first and second circuit measurement inputs.

16. The diagnostic tool of claim 13 wherein said microcontroller is suitably enabled to:
measure the voltage and current being supplied by the measured circuit;
determine if the measured voltage drops below said given minimum voltage before said given minimum current is detected; and
display a message on a display element indicating a low-voltage failure condition.

17. The diagnostic tool of claim 13 wherein said microcontroller is suitably enabled to:
measure the voltage and current being supplied by the measured circuit;
determine if the measured voltage remains at or above said given minimum voltage at the instant said given minimum current is detected; and
display a message on a display element indicating an adequate voltage and current condition.

18. An electrical circuit diagnostic tool that is adapted to measure current in a circuit, comprising:
first and second circuit measurement inputs;
a manual switch for initiating a circuit testing routine;
a microcontroller for running the circuit testing routine in response to activation of the manual switch by a user;
an active circuit loading element operated under the control of the microcontroller during the circuit testing routine;
a voltage measuring element;
a current measuring element; and
a display element;
wherein the microcontroller adjusts the active circuit loading element during the circuit testing routine such that at least one of the voltage measuring element and the current measuring element iteratively measures a varying voltage or current, respectively.

* * * * *